United States Patent
Chen et al.

(10) Patent No.: US 11,158,800 B2
(45) Date of Patent: Oct. 26, 2021

(54) METHOD FOR PATTERNING QUANTUM DOT LAYER, METHOD FOR MANUFACTURING DISPLAY DEVICE AND TRANSFER TEMPLATE

(71) Applicant: BOE Technology Group Co., Ltd., Beijing (CN)

(72) Inventors: Zhuo Chen, Beijing (CN); Yuanming Zhang, Beijing (CN); Wenhai Mei, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 65 days.

(21) Appl. No.: 16/129,622

(22) Filed: Sep. 12, 2018

(65) Prior Publication Data
US 2019/0296241 A1    Sep. 26, 2019

(30) Foreign Application Priority Data
Mar. 26, 2018   (CN) .......................... 201810253587.5

(51) Int. Cl.
*H01L 51/00* (2006.01)
*H01L 51/56* (2006.01)
(Continued)

(52) U.S. Cl.
CPC ...... *H01L 51/0016* (2013.01); *H01L 51/0003* (2013.01); *H01L 51/56* (2013.01); *H01L 27/3211* (2013.01); *H01L 51/502* (2013.01)

(58) Field of Classification Search
None
See application file for complete search history.

(56) References Cited

U.S. PATENT DOCUMENTS

| 10,026,913 B2 | 7/2018 | Kim et al. |
| 2010/0068468 A1* | 3/2010 | Coe-Sullivan ...... H01L 51/5012 428/172 |

(Continued)

FOREIGN PATENT DOCUMENTS

| CN | 102239108 A | 11/2011 |
| CN | 105070849 A | 11/2015 |

(Continued)

OTHER PUBLICATIONS

English translation of CN 10544911, 43 pp, retrieved from internet on May 20, 2020: https://worldwide.espacenet.com/patent/search/family/055559082/publication/CN105449111A?q=pn%3DCN105449111A (Year: 2020).*

(Continued)

*Primary Examiner* — David E Graybill
(74) *Attorney, Agent, or Firm* — McDermott Will & Emery LLP

(57) ABSTRACT

A method for patterning a quantum dot layer, a method for manufacturing a display device and a transfer template are provided in embodiments of the disclosure; the method for patterning a quantum dot layer, comprising: preparing a quantum dot layer on a substrate, the quantum dot layer comprising a reserved portion and a portion to be removed; bonding the portion to be removed with a plurality of convex portions provided on a transfer template, by pressing the transfer template against the quantum dot layer; and removing the portion to be removed with a removal of the transfer template, while retaining the reserved portion on the substrate.

17 Claims, 5 Drawing Sheets

(51) Int. Cl.
*H01L 27/32* (2006.01)
*H01L 51/50* (2006.01)

(56) References Cited

U.S. PATENT DOCUMENTS

| | | | |
|---|---|---|---|
| 2010/0283014 A1* | 11/2010 | Breen | C09K 11/565 |
| | | | 252/519.2 |
| 2011/0226995 A1 | 9/2011 | Tulsky et al. | |
| 2014/0042387 A1 | 2/2014 | Yang et al. | |
| 2015/0076469 A1* | 3/2015 | Ikemizu | H01L 51/5004 |
| | | | 257/40 |
| 2015/0368553 A1* | 12/2015 | Nelson | B32B 27/08 |
| | | | 428/323 |
| 2016/0340553 A1* | 11/2016 | Eckert | C09J 9/00 |
| 2017/0256730 A1* | 9/2017 | Kim | C09D 11/037 |
| 2019/0296241 A1* | 9/2019 | Chen | H01L 51/56 |

FOREIGN PATENT DOCUMENTS

| | | | |
|---|---|---|---|
| CN | 10544911 | * | 3/2016 |
| CN | 107004737 A | | 8/2017 |

OTHER PUBLICATIONS

Office Action issued in corresponding Chinese Patent Application No. 201810253587.5, dated Jul. 5, 2019.

* cited by examiner

1

1

METHOD FOR PATTERNING QUANTUM DOT LAYER, METHOD FOR MANUFACTURING DISPLAY DEVICE AND TRANSFER TEMPLATE

CROSS-REFERENCE TO RELATED INVENTION

The present disclosure claims the benefit of Chinese Patent Application Invention No. 201810253587.5 filed on Mar. 26, 2018 in the State Intellectual Property Office of China, the whole disclosure of which is incorporated herein by reference.

BACKGROUND OF THE INVENTION

Field of the Invention

Embodiments of the present disclosure relate to the field of display technology, and especially to a method for patterning a quantum dot layer, a method for manufacturing a display device, and a transfer template.

Description of the Related Art

As a method for preparing a quantum dot material develops in depth, both stability and light emitting efficiency of the quantum dot material increase continuously, a research on quantum dot light emitting diodes (abbreviated as QLED) becomes unceasingly thorough, a display device of quantum dot light emitting diodes has a broad application prospect in display field. Theoretically speaking, as compared with a relevant display device of organic light emitting diodes, the display device of QLED has technical advantages such as a better stability of light source, a longer service-life, a broader color gamut and an even lower cost and the like.

However, nowadays, the display device of QLED has not been made available for mass production yet, at least due to an important reason lying in that the there is no breakthrough in a patterning technology of the QLED at a high resolution. Due to the existence of inorganic nano particle features in the quantum dot material, such a material may not be formed into a film by evaporation and thus may not be patterned; and as an alternative, by an ink jet method, it is difficult to obtain a relatively high resolution as compared with a relevant display device.

A transfer printing method is a method which may implement a patterning of a quantum dot layer at a relatively high resolution. At present, a method for patterning a quantum dot layer by the transfer printing method may generally have workflow processes as below: preparing a quantum dot layer having a certain color, on a specific region of a carrier; next, adsorbing the quantum dot layer having the certain color on the carrier, by a transfer template; and then removing (e.g., by laminating) the adsorbed quantum dot layer from the transfer template and transferring such to a corresponding sub-pixel region of the certain color on a substrate so as to form a sub-pixel of the certain color.

However, it requires two transferring processes in the method as above, i.e., a first transferring process, in which the quantum dot layer of the specific region is transferred to the transfer template, and it requires that an adsorption force between the quantum dot layer and the transfer template being larger than another adsorption force between the quantum dot layer and the carrier; and a second transferring process, in which the quantum dot layer of the specific region is then transferred to the sub-pixel region on the substrate, and it requires that an adsorption force between the quantum dot layer and the transfer template being small than the other adsorption force between the quantum dot layer and the substrate. The two transferring processes have relatively demanding requirements on both process conditions and operations thereof, and on materials in contact with the quantum dot layer.

SUMMARY OF THE INVENTION

The embodiments of the present disclosure have been provided a method for patterning a quantum dot layer, a method for manufacturing a display device and a transfer template.

According to an aspect of the exemplary embodiment of the present disclosure, there is provided a method for patterning a quantum dot layer, comprising:

preparing a quantum dot layer on a substrate, the quantum dot layer comprising: a reserved portion; and a portion to be removed;

bonding the portion to be removed with a plurality of convex portions provided on a transfer template, by pressing the transfer template against the quantum dot layer; and removing the portion to be removed with a removal of the transfer template, while retaining the reserved portion on the substrate.

According to an embodiment of the disclosure, the portion to be removed is bonded to the plurality of convex portions by chemical bonds therebetween.

According to an embodiment of the disclosure, the quantum dot layer has a plurality of first groups, and the plurality of convex portions have a plurality of second groups, the plurality of first groups and the plurality of second groups being bondable with each other by chemical bonds therebetween; and bonding the portion to be removed with a plurality of convex portions comprising:

bonding the plurality of first groups in the portion to be removed and the plurality of second groups in the plurality of convex portions with each other by chemical bonds therebetween, by implementing at least one of an exposing to illumination by ultraviolet light and a heating on both the portion to be removed and the plurality of convex portions.

According to an embodiment of the disclosure, the plurality of first groups comprise at least one of sulfhydryl groups, amino groups, carboxyl groups, groups each having a double bond, groups each having a triple bond, and azides; and the plurality of second groups comprise at least one of sulfhydryl groups, amino groups, carboxyl groups, groups each having a double bond, groups each having a triple bond, and azides.

According to an embodiment of the disclosure, the method further comprises: prior to preparing a quantum dot layer on a substrate, a step of preparing a quantum dot material modified by ligands, comprising:

preparing a ligand material having the first groups; and preparing a quantum dot material modified by ligands, with both quantum dots and the ligand material.

According to an embodiment of the disclosure, preparing a quantum dot layer on a substrate comprises: preparing the quantum dot layer by the quantum dot material modified by ligands.

According to an embodiment of the disclosure, the method further comprises: prior to pressing the transfer template having the plurality of convex portions, against the quantum dot layer, a step of manufacturing the transfer template, comprising:

preparing a material of the transfer template having the second groups; and forming the material of the transfer template having the second groups into the transfer template, the transfer template being formed with the plurality of the convex portions having the plurality of second groups.

According to an embodiment of the disclosure, the method further comprises: prior to pressing the transfer template having the plurality of convex portions, against the quantum dot layer, a step of manufacturing the transfer template, comprising:

manufacturing a transfer template body, the transfer template body being formed to have the plurality of convex portions; and providing the plurality of convex portions with a plurality of second groups, by immersing the transfer template body into a solution having the second groups.

According to an embodiment of the disclosure, the method further comprises: prior to pressing the transfer template having the plurality of convex portions, against the quantum dot layer, a step of manufacturing the transfer template, comprising:

manufacturing a transfer template body, the transfer template body being formed to have the plurality of convex portions; and providing the plurality of convex portions with a plurality of second groups, by reacting the transfer template body with a material having the second groups by a surface chemical reaction occurring therebetween.

According to an embodiment of the disclosure, in response to implementing merely a illumination by ultraviolet light on both the portion to be removed and the plurality of convex portions, a light intensity as adopted ranges between 50 mJ/cm2 and 200 mJ/cm2.

According to an embodiment of the disclosure, in response to implementing merely a heating on both the portion to be removed and the plurality of convex portions, a temperature as adopted ranges between 80° C. and 120° C.

According to an embodiment of the disclosure, pressing the transfer template having the plurality of convex portions, against the quantum dot layer comprises:

aligning the transfer template with the quantum dot layer such that the plurality of convex portions of the transfer template are positioned corresponding to the portion to be removed; and pressing the transfer template against the quantum dot layer.

According to an embodiment of the disclosure, the method further comprises: following the removal of the transfer template, cross-linking the quantum dot material modified by ligands in the reserved portion, by implementing one of an illumination by ultraviolet light and a heating on the reserved portion.

According to an embodiment of the disclosure, in response to implementing merely an illumination by ultraviolet light on the reserved portion, a light intensity as adopted ranges between 50 mJ/cm2 and 200 mJ/cm2.

According to an embodiment of the disclosure, in response to implementing merely a heating on the reserved portion, a temperature as adopted ranges between 80° C. and 120° C.

According to another aspect of the exemplary embodiment of the present disclosure, there is further provided a method for manufacturing a display device, comprising:

using the method as above, wherein the reserved portion is a portion of the quantum dot layer provided at positions corresponding to regions of the substrate in which sub-pixels are to be formed, and the portion to be removed is the other portion of the quantum dot layer except for the reserved portion.

According to still another aspect of the exemplary embodiment of the present disclosure, there is further provided a transfer template, comprising:

a transfer template body having the plurality of convex portions; and second groups which are dispersed in the plurality of convex portions and are bondable with adjacent groups different therefrom, by chemical bonds.

According to an embodiment of the disclosure, the second groups comprise at least one of sulfhydryl groups, amino groups, carboxyl groups, groups each having a double bond, groups each having a triple bond, and azides.

BRIEF DESCRIPTION OF THE DRAWINGS

The above and other features and advantages of the present disclosure will become more apparent and a more comprehensive understanding of the present disclosure can be obtained, by describing in detail exemplary embodiments thereof with reference to the accompanying drawings, in which.

DETAILED DESCRIPTION OF EMBODIMENTS OF THE INVENTION

Figure 1:
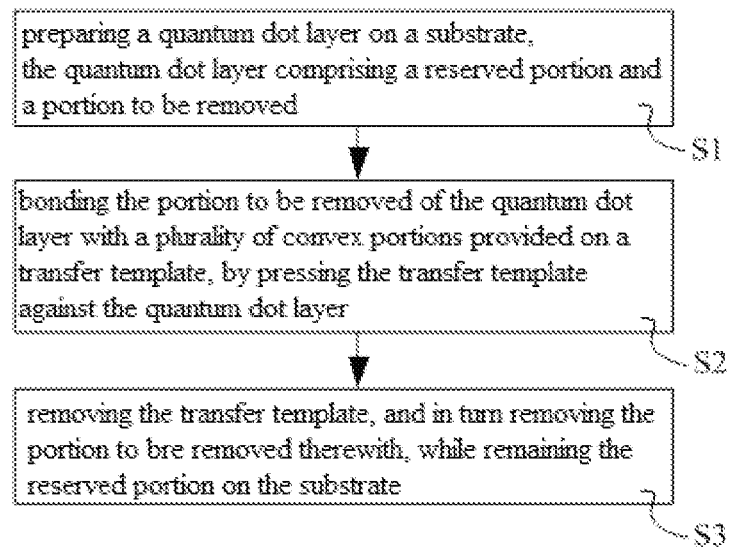
FIG. 1 illustrates a basic flowchart of a method for patterning a quantum dot layer, according to an embodiment of the disclosure.

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each component in the drawings re only intended to exemplarily illustrate the contents of the disclosure, rather than to demonstrate the practical dimension or proportion of components of a transfer template, display substrate, display panel.

Figure 3:
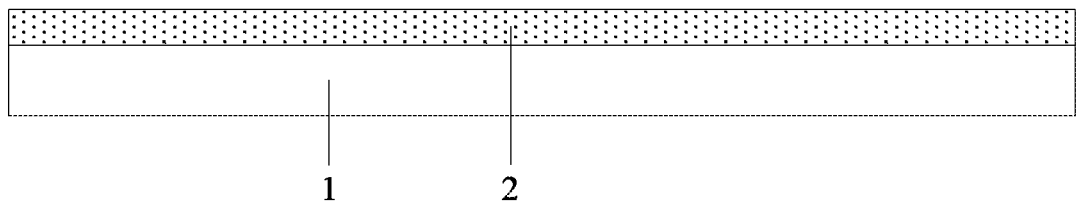
FIGS. 3-7 illustrate schematic views of various process steps of the method for patterning a quantum dot layer, according to an embodiment of the disclosure.

According to a general technical concept of embodiments of the present disclosure, a method for patterning a quantum dot layer is provided, e.g., as illustrated in FIG. 1, and FIGS. 3-7, the method for patterning a quantum dot layer comprising following steps:

S1: as illustrated in FIG. 3, preparing a quantum dot layer 2 on a substrate 1, the quantum dot layer 2 comprising a reserved portion and a portion to be removed.

In above step S1, the quantum dot layer 2 is for example formed by spin-coating a quantum dot material modified by ligands, and the quantum dot material modified by ligands is formed by coordination with a ligand material, on surfaces of quantum dots. The quantum dot layer 2 is formed by the quantum dot material modified by ligands, facilitating decreasing defects on surfaces of the quantum dots and improving compatibility between quantum dots and a matrix material of the quantum dot layer 2.

In addition, the 'portion to be removed' specifically refers to other portions of the quantum dot layer 2 except for the "reserved portion".

In a condition that the method for patterning the quantum dot layer is applied to manufacture sub-pixels of a QLED display device, then, a color of light rays emitted by the quantum dot layer 2 may be a certain color of sub-pixels in each pixel unit of the QLED display device, such as, red (R), green (G), blue (B), etc.

Based on the above, as to a patterning process for the quantum dot layer, it has a purpose of forming sub-pixels of a certain color; therefore, in this step, an object region on the substrate 1, on which the sub-pixels of the certain color are to be formed, may be referred to as a region on which the sub-pixels are to be formed. It should be emphasized that, as far as the 'region on which the sub-pixels are to be formed' as provided in embodiments of the disclosure is concerned, it refers to a region that the sub-pixels of the certain color to be formed are provided corresponding thereto (e.g., aligned therewith), rather than a region that sub-pixels of all colors to be formed are provided corresponding thereto. As such, the reserved portion of the quantum dot layer 2 refers to a portion of the quantum dot layer 2 provided corresponding to the 'region on which the sub-pixels are to be formed' of the substrate 1, and the other portion of the quantum dot layer except for the reserved portion is the portion to be removed, the portion to be removed will be bonded from the substrate 1 to the transfer template as set forth in detail hereinafter, and then removed from the substrate 1 with a removal of the transfer template.

Figure 4:
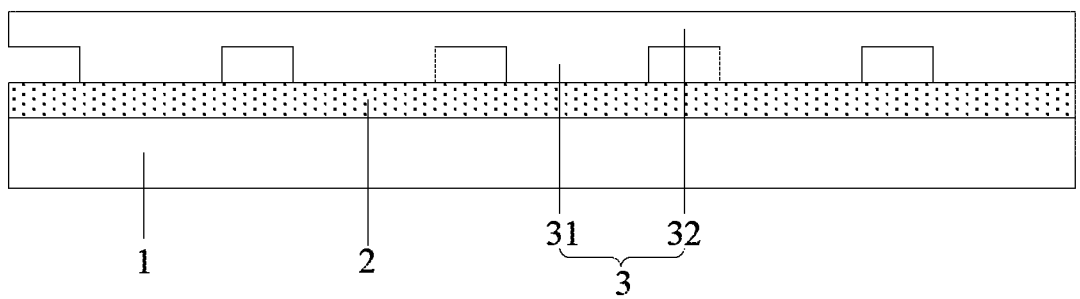
Figure 5:
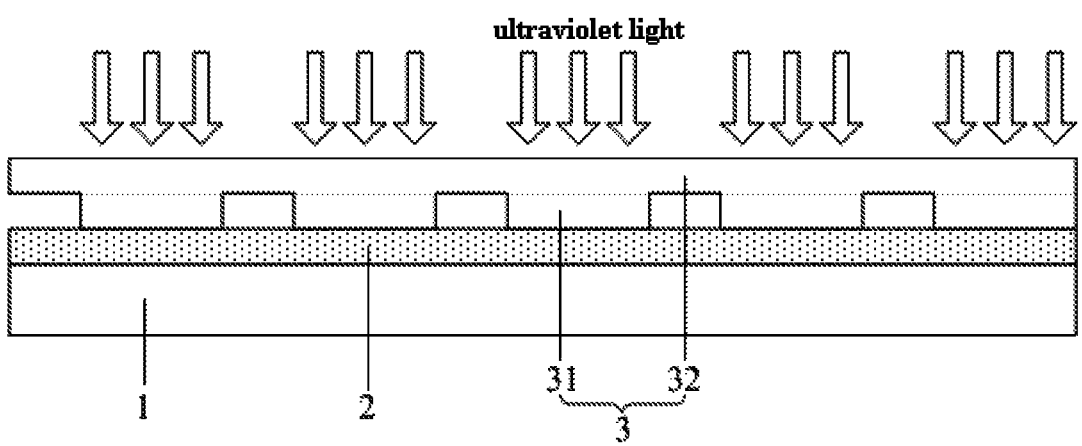

S2: as illustrated in FIG. 4, bonding the portion to be removed of the quantum dot layer 2 with a plurality of convex portions 31 provided on a transfer template 3, by pressing the transfer template 3 having a plurality of convex portions 31 spaced from one another against the quantum dot layer 2. And adjacent ones of the plurality of convex portions 31 are spaced apart from one another by concave portions provided therebetween or thereamong.

In above step S2, the transfer template may be formed integrally by a PDMS (i.e., Polydimethylsiloxane) material.

The transfer template 3 adopts a structure as follows: continuing to refer to FIG. 4, the transfer template 3 comprises: a support plate 32, and a plurality of convex portions 31 disposed on a surface of the support plate 32. When the transfer template 3 is pressed against the quantum dot layer 2, the transfer template 3 is for example arranged such that, the plurality of convex portions 31 of the transfer template 3 are aligned with the portion to be removed of the quantum dot layer 2, and finally a removal of the portion to be removed of the quantum dot layer 2 is implemented, e.g., by combining/bonding the plurality of convex portions 31 of the transfer template 3 with the portion to be removed of the quantum dot layer 2, in subsequent step(s), without any undesirable removal of any portion in the quantum dot layer 2 not required to be removed, which removal may be caused by a combining/bonding between other portion(s) of the transfer template 3 and the quantum dot layer 2. In other words, it may ensure that the reserved portion will be reserved completely and intactly.

Based on the structure of the transfer template 3 as above, the step S2 may for example comprise following processes: aligning the transfer template 3 with the quantum dot layer 2 such that the plurality of convex portions 31 of the transfer template 3 are positioned corresponding to (e.g., aligned with) the portion to be removed of the quantum dot layer 2; and then pressing the transfer template 3 against the quantum dot layer 2, such that the plurality of convex portions 31 of the transfer template 3 is in contact with the portion to be removed of the quantum dot layer 2. In addition, after the transfer template 3 is pressed against the quantum dot layer 2, then a certain pressure may be applied onto the transfer template 3, facilitating a more tight and compact and secured combining/bonding between the plurality of convex portions 31 of the transfer template 3 and the portion to be removed of the quantum dot layer 2 in a subsequent process.

In above step S2, a specific way for combining/bonding the portion to be removed of the quantum dot layer 2 and the plurality of convex portions 31 of the transfer template 3 may for example be a bonding by chemical bonds therebetween. As compared with other combining/bonding ways, the chemical bonds may implement a more secured combining/bonding between the quantum dot layer 2 and the transfer template 3, facilitating a more smooth, clean and thorough removal of the portion to be removed of the quantum dot layer 2 from the substrate 1 in a subsequent process, by a binding force between the quantum dot layer 2 and the transfer template 3. Said "bonding by chemical bonds" in the embodiment refers to that the portion to be removed of the quantum dot layer 2 and the plurality of convex portions 31 of the transfer template 3 are modified chemically, respectively, such that both may carry active groups; then, in response to a condition that the portion to be removed by the quantum dot layer 2 and the plurality of convex portions 31 of the transfer template 3 are in contact with each other (and are pressed against each other), they are combined/bonded with each other, by a bonding therebetween due to respective active groups.

Specifically, above technical solution may be implemented as below: the quantum dot layer 2 has a plurality of first groups; and in the transfer template 3, the plurality of convex portions 31 of the transfer template 3 have a plurality of second groups, the plurality of first groups and the plurality of second groups being bondable with each other by chemical bonds therebetween. And further referring to FIG. 5, when the portion to be removed of the quantum dot layer 2 is bonded with the plurality of convex portions 31 of the transfer template 3, the plurality of first groups in the portion to be removed of the quantum dot layer 2 and the plurality of second groups in the plurality of convex portions 31 of the transfer template 3 are bonded with each other by chemical bonds created therebetween, by exposing to illumination with a ultraviolet light rays (abbreviated as UV light hereinafter) or by heating, both the portion to be removed and the plurality of convex portions 31 of the transfer template 3.

It should be noticed that, if both the portion to be removed of the quantum dot layer 2 and the plurality of convex portions 31 of the transfer template 3 are merely illuminated by UV light, then the illumination may have a light intensity, e.g., of 50 mJ/cm² to 150 mJ/cm²; and if both the portion to be removed of the quantum dot layer 2 and the plurality of convex portions 31 of the transfer template 3 are merely heated, then a temperature at which the heating is implemented may for example be 80° C.–120° C.

The plurality of first groups for example comprise at least one of sulfhydryl groups, amino groups, carboxyl groups, groups each having a double bond, groups each having a triple bond, and azides; and the plurality of second groups for example comprise at least one of sulfhydryl groups, amino groups, carboxyl groups, groups each having a double bond, groups each having a triple bond, and azides; and it is required that the plurality of first groups and the plurality of second groups may be bonded with each other by the chemical bonds created therebetween. A feasible combination which may be bonded by the chemical bonds between the plurality of first groups and the plurality of second groups may for example lie in that: the plurality of first groups comprise sulfhydryl groups and the plurality of second groups comprise groups each having a double bond; or, the plurality of first groups comprise groups each having a double bond and the plurality of second groups comprise sulfhydryl groups; or alternatively, the plurality of first groups comprise sulfhydryl groups and the plurality of second groups comprise groups each having a triple bond; or, the plurality of first groups comprise groups each having a triple bond and the plurality of second groups comprise sulfhydryl groups; or alternatively, the plurality of first groups comprise azides and the plurality of second groups comprise groups each having a triple bond; or, the plurality of first groups comprise groups each having a triple bond and the plurality of second groups comprise azides; or alternatively, the plurality of first groups comprise amino groups and the plurality of second groups comprise carboxyl groups; or, the plurality of first groups comprise carboxyl groups and the plurality of second groups comprise amino groups; and the like.

By way of example, in case that the plurality of first groups may comprise sulfhydryl groups and the plurality of second groups may comprise groups each having a double bond, an equation in which chemical bonds are created therebetween is as follows:

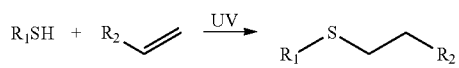

Figure 2:
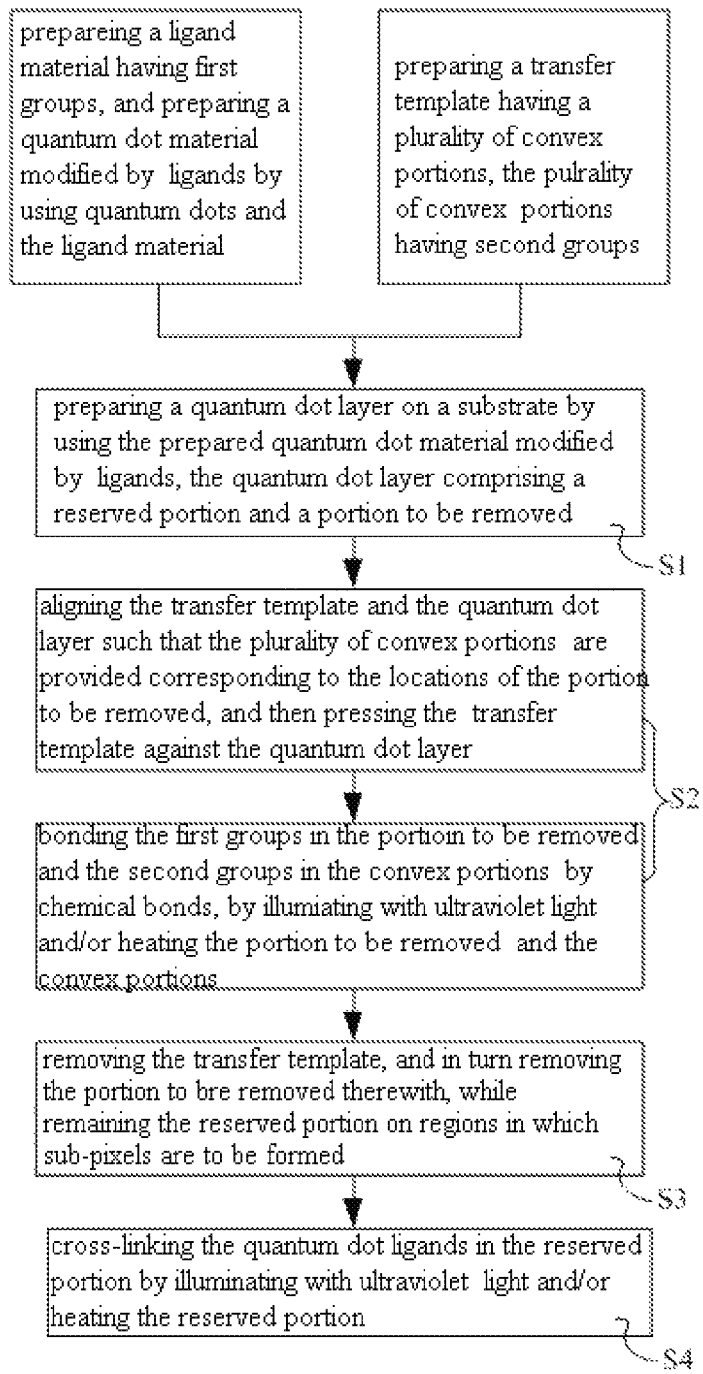
FIG. 2 illustrates a specific flowchart of the method for patterning a quantum dot layer, according to an embodiment of the disclosure.

As illustrated in FIG. 2, in the method for patterning the quantum dot layer according to the embodiment of the disclosure, in order to ensure that the quantum dot layer 2 has the plurality of first groups, e.g., prior to the step S1 of preparing the quantum dot layer 2, there may further be an additional step of preparing a quantum dot material modified by ligands, and exemplarily, such a step of preparing the quantum dot material modified by ligands may for example specifically comprise: firstly, preparing a ligand material having the first groups; and then, preparing a quantum dot material modified by ligands, by using both quantum dots and the ligand material. And when the ligand material is prepared, by way of example, a material having the plurality of first groups are doped into a certain organic material so as to form the ligand material; and in a process of preparing the quantum dot material modified by ligands, the ligand material reacts in a coordination reaction with quantum dots, such that they are bonded with each other by coordination bonds therebetween, and finally the ligand material are attached onto surfaces of quantum dots. By above steps, the quantum dot material which has the plurality of first groups and is modified by ligands is prepared, and then the quantum dot material modified by ligands is used to prepare the quantum dot layer 2, therefore, the quantum dot layer 2 naturally has the plurality of first groups.

As illustrated in FIG. 2, in the method for patterning the quantum dot layer according to the embodiment of the disclosure, in order to ensure that the transfer template 3 has the plurality of second groups, e.g., prior to the step S2 of pressing the transfer template 3 against the quantum dot layer 2, there may further be another additional step of manufacturing the transfer template, and exemplarily, such a step of manufacturing the transfer templates may for example specifically comprise: firstly, preparing a material of the transfer template having the second groups, and then, forming the material of the transfer template having the second groups into the transfer template, the transfer template being formed with the plurality of the convex portions spaced apart from one another and having the plurality of second groups; or alternatively, firstly, manufacturing a transfer template body, the transfer template body being formed to have the plurality of convex portions spaced apart from one another, and then, providing the plurality of convex portions with a plurality of second groups by immersing the transfer template body into a solution having the second groups; or alternatively, firstly, manufacturing a transfer template body, the transfer template body being formed to have the plurality of convex portions; and then providing the plurality of convex portions with a plurality of second groups by reacting the transfer template body with a material having the second groups by a surface chemical reaction occurring therebetween. The method for manufacturing the transfer template comprises but is not limited to above methods, without being listed herein one by one.

Figure 6:
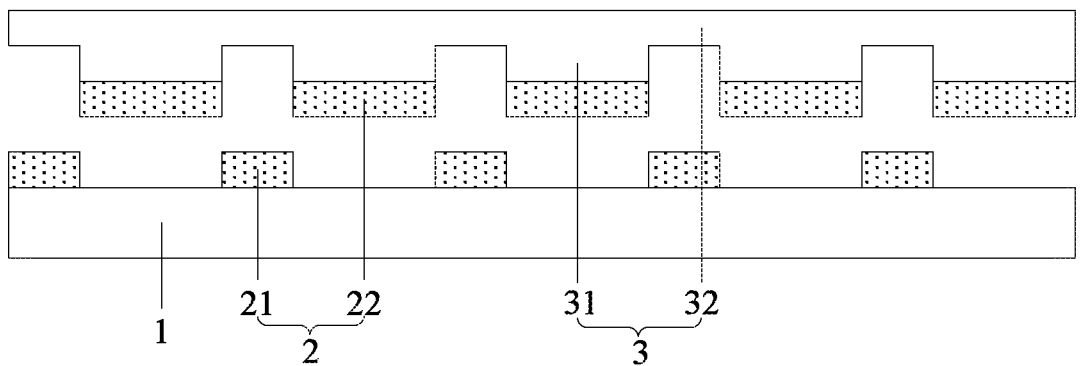

S3: as illustrated in FIG. 6, the transfer template 3 is removed, and since the portion 22 to be removed of the quantum dot layer 2 is combined/bonded with the plurality of convex portions 31 of the transfer template 3, then, the portion 22 to be removed of the quantum dot layer 2 may be removed with a removal of the transfer template 3, while the reserved portion 21 of the quantum dot layer 2 is retained on the substrate 1.

For example, this is because that, an adsorption force/binding force between the portion 22 to be removed of the quantum dot layer 2 and the plurality of convex portions 31 of the transfer template 3, both of which produce respective active groups combined/bonded by the chemical bonds therebetween due to exposing to illumination by UV light and/or heating applied on both of them, may be larger than an adsorption force/binding force between the portion 22 to be removed of the quantum dot layer 2 and the substrate 1, which portion 22 is exposed to illumination by UV light and/or heating applied thereon, so as to ensure that the portion to be removed may be removed from the substrate 1 smoothly and sufficiently with the removal of the transfer template 3.

Furthermore, by way of example, the binding force between the portion 22 to be removed of the quantum dot layer 2 and the substrate 1, which portion 22 is exposed to illumination by UV light and/or heating applied thereon, may be smaller than a binding force between the reserved portion 21 of the quantum dot layer 2 and the substrate 1, which portion 21 is exposed to neither illumination by UV light nor heating; and a binding force between the portion 22 to be removed of the quantum dot layer 2 which is exposed to illumination by UV light and/or heating applied thereon, and the reserved portion 21 of the quantum dot layer 2 which portion 21 is exposed to neither illumination by UV light nor heating, may be smaller than the binding force between the reserved portion 21 of the quantum dot layer 2 and the substrate 1, which portion 21 is exposed to neither illumination by UV light nor heating. As such, when the transfer template 3 is removed, a disengagement may occur above all between the portion to be removed 22 of the quantum dot layer 2 which is exposed to illumination by UV light and/or heating applied thereon, and the reserved portion 21 of the quantum dot layer 2 which portion is exposed to neither illumination by UV light nor heating, without an opportunity of any disengagement of the reserved portion 21 of the quantum dot layer 2 which portion is exposed to neither illumination by UV light nor heating from the substrate 1 occurring with the removal of the transfer template 3. Therefore, it is ensured that the reserved portion 21 of the quantum dot layer 2 may substantially completely reserved on the substrate 1.

If above method for patterning the quantum dot layer is used to manufacture sub-pixels of a QLED display device, then, after step S3, the reserved portion 21 of the quantum dot layer 2 is still retained on the 'region on which the sub-pixels are to be formed' of the substrate 1, such that the reserved portion 21 of the quantum dot layer 2 may for example functions as sub-pixels to be formed.

In above step S3, in order to ensure that the portion 22 to be removed of the quantum dot layer 2 may be completely removed in the removal process thereof, without leaving any residual thereof on the substrate 1, for example, a thickness of the quantum dot layer 2 may be under control so as to avoid an excessively large thickness thereof. Exemplarily, an overall thickness of the quantum dot layer 2 is for example 10 nm~20 nm, and furthermore, it may for example be not more than 30 nm. As to a quantum dot layer 2 which is formed by a plurality of (e.g., two or three) film layers laminated with each other or one another, by way of example, by controlling a concentration of a solution of the quantum dot material modified by ligands and a temperature at which the quantum dot layer 2 is heated during a spin coating thereof, a combination/bonding among various layers of films of each of the portion to be removed of the quantum dot layer 2 and the reserved portion may be made more compact, respectively, such that a substantially overall removal of the portion to be removed of the quantum dot layer 2, and a substantially overall reserve of the reserved portion of the quantum dot layer 2 may be implemented respectively, avoiding any residual during or after the removal.

Figure 7:
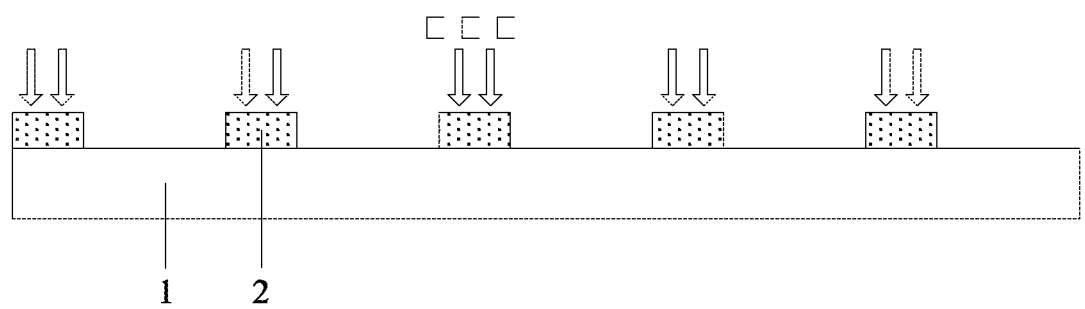

Referring to FIG. 1, FIG. 2 and FIG. 7, in the method for patterning the quantum dot layer according to the embodiment of the disclosure, in order to prevent any failure/defect (such as damage/impairment, exfoliation and the like) of the reserved portion 21 of the quantum dot layer 2 during subsequent steps such as cleaning, manufacturing sub-pixels of other color(s), and the like, then, for example, a step S4 may be provided following the step S3, specifically, the step S4 comprising: cross-linking the quantum dot material modified by ligands in the reserved portion 21, by implementing an illumination by ultraviolet light or a heating on the reserved portion 21 of the quantum dot layer 2, such that the reserved portion 21 has a more stable structure.

It should be noticed that, if merely an illumination by ultraviolet light is implemented on the reserved portion 21 of the quantum dot layer 2, then a light intensity as adopted for example ranges between 50 mJ/cm$^2$ and 150 mJ/cm$^2$. And if merely a heating is implemented on the reserved portion 21 of the quantum dot layer 2, then a temperature as adopted for example ranges between 80° C. and 120° C.

From the whole workflow processes of the method for patterning the quantum dot layer as above, it may not be difficult to see that, in the method for patterning the quantum dot layer of the embodiment of the disclosure, only one transfer is required, i.e., transferring the portion 22 to be removed of the quantum dot layer 2 from the substrate 1 to the transfer template 3, which only requires that an adsorption force between the quantum dot layer 2 and the transfer template 3 is larger than that between the quantum dot layer 2 and the substrate 1. And as once mentioned in the background portion, two transfers are required for patterning in a method of transfer in the relevant art. It is apparent that the technical solution of the embodiment of the disclosure reduces the specific number of transfer as compared with the relevant art, which facilitate lowering requirements on specific material being in contact with the quantum dot layer 2 and requirements on process conditions during the transfer, such that a difficulty in operation for patterning the quantum dot layer 2 at a relatively high resolution may be decreased so as to provide technical supports for a mass production of the QLED display device.

In addition, two alignments are required in the method of transfer in the relevant art, i.e., a first alignment is to align the transfer template and the carrier for carrying the quantum dot layer, and a second alignment is to align the transfer template and the substrate on which the sub-pixels are to be prepared. The two alignments may, on the one hand, cause a complicated and time-consuming multi-step operation and a prolonged production period; and on the other hand, adversely influence a product yield due to more than one alignment since the product yield may be influenced directly due to specific level of accuracy in alignment. In comparison, with the technical solution in the embodiment of the disclosure, it is only required that the transfer template 3 is aligned with the substrate 1 as per a scheduled order in the whole processes of patterning, decreasing the specific number of alignment and in turn simplifying steps in operation and shortening the production period, while decreasing the adverse influence on the product yield as applied by the accuracy in alignment and in turn improving the product yield.

It should be noticed that, by the whole workflow processes of the method for patterning the quantum dot layer as above, sub-pixels of a certain object color may be formed on the substrate 1; and by repeating above workflow processes, with the quantum dot material which is modified by ligands and thus is capable of emitting light rays of the object color, in each repeating, then sub-pixels of other colors as required may be formed sequentially.

Based on the method for patterning the quantum dot layer according to the embodiment of the disclosure, a method for manufacturing a display device is further provided in another embodiment of the disclosure, comprising: manufacturing sub-pixels on the substrate by the method as provided in the embodiment of the disclosure. The method for manufacturing a display device is adapted to manufacturing sub-pixels in a QLED display device, and may implement patterning the quantum dot layer at a relatively high resolution, with simply operations and ease for implementation, so as to facilitate a mass production of the QLED display device. Of course, the method for manufacturing a display device may also be applied to other scenarios which may require to pattern the quantum dot layer, e.g., manufacturing a color filter layer of quantum dots in a relevant display device.

In the embodiment of the disclosure, a preparation of the QLED display device is taken as an example.

Figure 8:
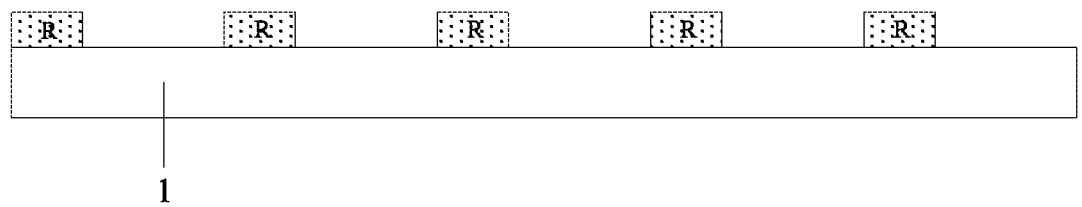
FIGS. 8-10 illustrate schematic views of various steps of a process for manufacturing sub-pixels of a display device, according to an embodiment of the disclosure.
Figure 9:
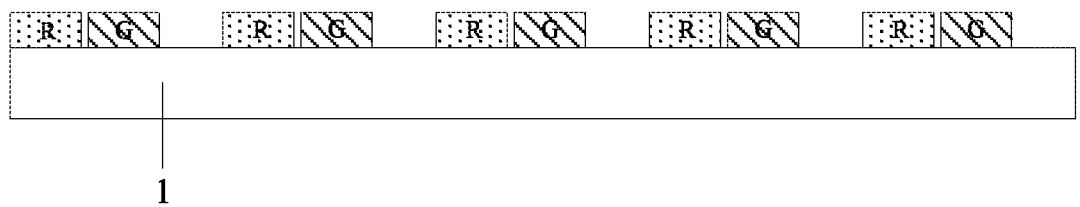
Figure 10:
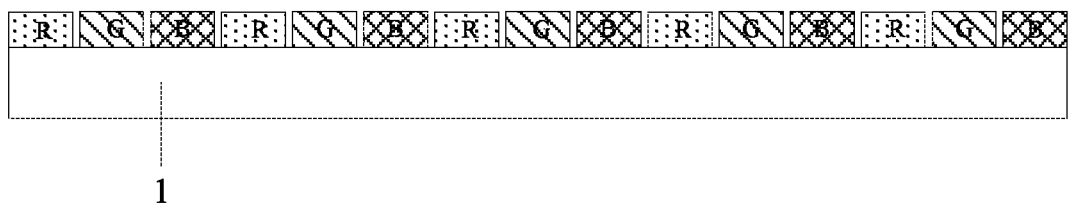

By way of example, as to a QLED display device constructed on the basis of three primary colors R, G, B, as illustrated in FIG. 8, red sub-pixels may be formed on the substrate 1, by using a quantum dot material which is modified by ligands and is capable of emitting red light ray, with the workflow processes of the method for patterning the quantum dot layer as provided above in the embodiment of the disclosure; and then, as illustrated in FIG. 9, green sub-pixels may be formed on the substrate 1, by repeating above workflow process once, with another quantum dot material which is modified by ligands and is capable of emitting green light; as illustrate in FIG. 10, finally, blue sub-pixels may be formed on the substrate 1, by repeating above workflow process in turn, with the other quantum dot material which is modified by ligands and is capable of emitting blue light.

It should be noticed that, in a final stage of preparing sub-pixels of a specific color (e.g., referred to as X color), the sub-pixels of the X color (i.e., the reserved portion of the quantum dot layer of X color) may be illuminated by ultraviolet light and/or heated so as to be cross-linked, and the cross-linked sub-pixels of X color may be fixed pretty securely on the substrate, and an own structure of each of the sub-pixels of X color may be very firm and strong. As such, once the preparation of the sub-pixels of X color is completed and when sub-pixels of another color (e.g., referred to as Y color) are to be manufactured, then, another quantum dot material which is modified by ligands and capable of emitting light of Y color may be coated directly onto a side of the sub-pixels of X color facing away from the substrate so as to form a quantum dot layer of Y color. Since the sub-pixels of X color are fixed pretty securely on the substrate, and the own structure of each of the sub-pixels of X color may be very firm and strong, then, during a process in which the portion to be removed of the quantum dot layer which is capable of emitting light of Y color (a part of said portion to be removed covering the sub-pixels of X color) is removed by using the transfer template, the sub-pixels of X color may neither be peeled off from the substrate, nor be damaged or impaired.

Furthermore, in a condition that the another quantum dot material which is modified by ligands and capable of emitting light of Y color is directly coated onto a side of the sub-pixels of X color facing away from the substrate so as to form a quantum dot layer capable of emitting light of Y color, then steps of the quantum dot layer capable of emitting light of Y color may be formed at edges of the sub-pixels of X color; in order to avoid any residual of the another quantum dot material which is modified by ligands and capable of emitting light of Y color, at the steps in a subsequent step of removing the portion to be removed of the quantum dot layer capable of emitting light of Y color, a transfer template of a soft texture (e.g., a transfer template of PDMS) may be selected to be used in the removal. In a condition that the portion to be removed of the quantum dot layer capable of emitting light of Y color is removed, due to the soft texture of the transfer template, then, a plurality of convex portions of the transfer template may be in contact in a relatively form-fitting manner with the portion to be removed (comprising the steps as above) of the quantum dot layer capable of emitting light of Y color when the transfer template is pressed against the quantum dot layer capable of emitting Y color, such that the convex portions of the transfer template may be combined/bonded compactly and closely with the quantum dot layer capable of emitting light of Y color at the steps, and the quantum dot layer capable of emitting light of Y color at the steps may in turn be removed entirely and completely. Furthermore, in order to further decrease the residual of the another quantum dot material which is modified by ligands and capable of emitting light of Y color at the steps, for example, when the transfer template is pressed against the quantum dot layer capable of emitting light of Y color, a pressure may be applied onto regions on the transfer template at which the convex portions are located, especially at locations of the convex portions of the transfer template provided corresponding to (e.g., adjacent to) the steps, such that the convex portions of the transfer template may be combined/bonded more compactly and closely with portions of the quantum dot layer capable of emitting light of Y color at the steps, facilitating a complete and clear removal of the portion to be removed of the quantum dot layer of Y color subsequently.

As to relevant LED display device (comprising the QLED display device), it is required to manufacture a pixel defining layer (abbreviated as PDL) prior to manufacturing sub-pixels by evaporation or printing, such that various sub-pixels manufactured subsequently may be isolated and spaced apart from one another. In comparison, in the method for manufacturing a QLED display device according to an embodiment of the disclosure, since sub-pixels are manufactured by the method for patterning the quantum dot layer as above in such embodiment, with a strong controllability and high accuracy, such that various sub-pixels are naturally isolated and spaced apart from one another once formed, without any requirement of manufacturing the pixel defining layer prior to manufacturing the sub-pixels, and in turn eliminating the pixel defining layer and a step for manufacturing the same, facilitating simplification of both structures of film layers of the product and the process steps.

In the method for manufacturing the QLED display device according to an embodiment of the disclosure, prior to the steps of manufacturing the sub-pixels of various colors, the method may for example further comprise: manufacturing sequentially a first electrode, a first carrier injection layer and a first carrier transporting layer on the substrate 1. Moreover, following the steps of manufacturing the sub-pixels of various colors, the method may for example comprise: manufacturing sequentially a second carrier transporting layer, a second carrier injection layer and a second electrode on a side of the sub-pixels of various colors facing away from the substrate 1. As such, the first electrode, the first carrier injection layer, the first carrier transporting layer, the sub-pixels, the second carrier transporting layer, the second carrier injection layer and the second electrode which are overlapped with one another correspondingly may form collectively quantum dot light emitting diode(s), such that when voltages are applied respectively on the first electrode and the second electrode so as to create a pressure difference therebetween, the quantum dots in the sub-pixels may emit light of corresponding color(s).

As an exemplary implementation, the first electrode may for example be an anode, the first carrier injection layer may be a hole injection layer and the first carrier transporting layer may be a hole transporting layer; and the second electrode may for example be a cathode, the second carrier injection layer may be an electron injection layer and the second carrier transporting layer may be an electron transporting layer.

In addition, prior to manufacturing the first electrode on the substrate, the method may for example further comprise a step of manufacturing an array of thin film transistors (abbreviated as TFTs) on the substrate 1. In the display device, the first electrode of each of the quantum dot light emitting diodes has a corresponding TFT, e.g., each first electrode is connected with a respective one thin film transistor, so as to implement a driving control on the corresponding quantum dot light emitting diode.

Based on the method for patterning the quantum dot layer according to the embodiment of the disclosure, a quantum dot material modified by ligands is further provided in still another embodiment of the disclosure, the quantum dot material modified by ligands comprising: quantum dots; and a ligand material surrounding and covering the quantum dots, the ligand material having first groups which are bondable with adjacent groups different therefrom, by chemical bonds, such that the quantum dot layer formed by the quantum dot material modified by ligands is bondable with the transfer template having matching groups therewith, by chemical bonds. It should be noticed that, said 'matching' means that two groups are bondable by chemical bonds.

And the first groups of the ligand material may for example comprise at least one of sulfhydryl groups, amino groups, carboxyl groups, groups each having a double bond, groups each having a triple bond, and azides and the like.

Processes for preparing the quantum dot material modified by ligands may for example refer to relevant depictions concerning steps of preparing the quantum dot material modified by ligands in the method for patterning the quantum dot layer as above, without repeating herein any more.

Based on the method for patterning the quantum dot layer according to the embodiment of the disclosure, a transfer template is further provided in yet another embodiment of the disclosure, the transfer template comprising: a transfer template body having the plurality of convex portions; and second groups which are dispersed in the plurality of convex portions and are bondable with adjacent groups different therefrom, by chemical bonds, such that the plurality of convex portions of the transfer template are bondable with the quantum dot layer having matching groups therewith, by chemical bonds. It should be noticed that, said 'matching' means that two groups are bondable by chemical bonds.

And the second groups may for example comprise at least one of sulfhydryl groups, amino groups, carboxyl groups, groups each having a double bond, groups each having a triple bond, and azides and the like. When the quantum dot layer is patterned by the transfer template according to the embodiment of the disclosure, the second groups of the transfer template may be provided corresponding to the first groups of the quantum dot layer, for example, specifically referring to relevant depictions concerning combination/bonding between the first groups and the second groups in the method for patterning the quantum dot layer as above, without repeating herein any more.

There are several advantageous technical effects brought about by the technical solutions as provided in embodiments of the disclosure, as below:

In the method for patterning the quantum dot layer as above, only one transfer is required to transfer the portion to be removed of the quantum dot layer from the substrate to the transfer template, which only requires that an adsorption force between the quantum dot layer and the transfer template is larger than the adsorption force between the quantum dot layer and the substrate; and as compared with a method of transfer in the relevant art which requires two transfers, it is apparent that the technical solution of the disclosure decreases the specific number of transfer, facilitating lowering both requirements on specific material being in contact with the quantum dot layer and requirements on process conditions during the transfer, such that a difficulty in operation for patterning the quantum dot layer at a relatively high resolution may be decreased so as to provide technical supports for a mass production of the QLED display device.

By applying the method for patterning the quantum dot layer on the processes of manufacturing the sub-pixels of the QLED display device, sub-pixels may be manufactured at a relatively high resolution.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present disclosure exemplarily, and should not be deemed as a restriction thereof.

Although several exemplary embodiments of the general concept of the present disclosure have been shown and described, it would be appreciated by those skilled in the art that various changes or modifications may be made in these embodiments without departing from the principles and spirit of the disclosure and lie within the scope of present application, which scope is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A method for patterning a quantum dot layer, comprising:
    preparing a quantum dot layer on a substrate in direct physical contact with the substrate, the quantum dot layer comprising: a reserved portion which is always retained remaining on the substrate during the method, and a portion to be removed;
    bonding the portion to be removed with convex portions provided on a transfer template, by pressing the transfer template against the quantum dot layer; and
    removing the portion to be removed with a removal of the transfer template, while retaining the reserved portion on the substrate,
    wherein the reserved portion is a portion of the quantum dot layer provided at positions corresponding to regions of the substrate in which sub-pixels are formed, and the portion to be removed is another portion of the quantum dot layer except for the reserved portion, and
    wherein the method further comprises:
        a pre-step before the preparing a quantum dot layer on a substrate, the pre-step comprising: manufacturing sequentially a first electrode and a first carrier transporting layer on the substrate; and
        a post-step after the removing the portion to be removed with a removal of the transfer template, while retaining the reserved portion on the substrate, the post-step comprising: manufacturing sequentially a second carrier transporting layer and a second electrode on a side of sub-pixels of various colors facing away from the substrate.

2. The method according to claim 1, wherein the portion to be removed is bonded to the convex portions by chemical bonds therebetween.

3. The method according to claim 2, wherein the quantum dot layer has a plurality of first groups, and the convex portions have a plurality of second groups, the plurality of first groups and the plurality of second groups being bondable with each other by chemical bonds therebetween; and
bonding the portion to be removed with the convex portions comprising:
bonding the plurality of first groups in the portion to be removed and the plurality of second groups in the convex portions with each other by chemical bonds therebetween, by implementing at least one of an exposing to illumination by ultraviolet light and a heating on both the portion to be removed and the convex portions.

4. The method according to claim 3, wherein the plurality of first groups comprise at least one of sulfhydryl groups, amino groups, carboxyl groups, groups each having a double bond, groups each having a triple bond, and azides; and the plurality of second groups comprise at least one of sulfhydryl groups, amino groups, carboxyl groups, groups each having a double bond, groups each having a triple bond, and azides.

5. The method according to claim 3, further comprising: prior to preparing a quantum dot layer on a substrate, a step of preparing a quantum dot material modified by ligands, comprising:
preparing a ligand material having the first groups; and
preparing a quantum dot material modified by ligands, with both quantum dots and the ligand material.

6. The method according to claim 5, wherein preparing a quantum dot layer on a substrate comprises: preparing the quantum dot layer by the quantum dot material modified by ligands.

7. The method according to claim 3, further comprising: prior to pressing the transfer template having the convex portions, against the quantum dot layer, a step of manufacturing the transfer template, comprising:
preparing a material of the transfer template having the second groups; and
forming the material of the transfer template having the second groups into the transfer template, the transfer template being formed with the convex portions having the plurality of second groups.

8. The method according to claim 3, further comprising: prior to pressing the transfer template having the plurality of convex portions, against the quantum dot layer, a step of manufacturing the transfer template, comprising:
manufacturing a transfer template body, the transfer template body being formed to have the plurality of convex portions; and
providing the plurality of convex portions with a plurality of second groups, by immersing the transfer template body into a solution having the second groups.

9. The method according to claim 3, further comprising: prior to pressing the transfer template having the plurality of convex portions, against the quantum dot layer, a step of manufacturing the transfer template, comprising:
manufacturing a transfer template body, the transfer template body being formed to have the plurality of convex portions; and
providing the plurality of convex portions with a plurality of second groups, by reacting the transfer template body with a material having the second groups by a surface chemical reaction occurring therebetween.

10. The method according to claim 3, wherein upon implementing the illumination by ultraviolet light on both the portion to be removed and the convex portions, an intensity of the ultraviolet light ranges between 50 mJ/cm$^2$ and 200 mJ/cm$^2$.

11. The method according to claim 3, wherein upon implementing the heating on both the portion to be removed and the convex portions, a temperature of the heating temperature ranges between 80° C. and 120° C.

12. The method according to claim 1, wherein pressing the transfer template having the convex portions, against the quantum dot layer comprises:
aligning the transfer template with the quantum dot layer such that the convex portions of the transfer template are positioned corresponding to the portion to be removed; and
pressing the transfer template against the quantum dot layer.

13. The method according to claim 1, further comprising: following the removal of the transfer template, cross-linking the quantum dot material modified by ligands in the reserved portion, by implementing one of an illumination by ultraviolet light and a heating on the reserved portion.

14. The method according to claim 13, wherein upon implementing the illumination by the ultraviolet light on the reserved portion, an intensity of the ultraviolet light is between 50 mJ/cm$^2$ and 200 mJ/cm$^2$.

15. The method according to claim 13, wherein upon implementing the heating on the reserved portion, a temperature of the heating ranges between 80° C. and 120° C.

16. A method of manufacturing a display device, comprising:
using a method for patterning a quantum dot layer, comprising:
preparing a quantum dot layer on a substrate in direct physical contact with the substrate, the quantum dot layer comprising: a reserved portion which is always retained remaining on the substrate during the method, and a portion to be removed;
bonding the portion to be removed with convex portions provided on a transfer template, by pressing the transfer template against the quantum dot layer; and
removing the portion to be removed with a removal of the transfer template, while retaining the reserved portion on the substrate,
wherein the reserved portion is a portion of the quantum dot layer provided at positions corresponding to regions of the substrate in which sub-pixels are formed, and the portion to be removed is another portion of the quantum dot layer except for the reserved portion,
wherein the method further comprises:
a pre-step before the preparing a quantum dot layer on a substrate, the pre-step comprising: manufacturing sequentially a first electrode and a first carrier transporting layer on the substrate; and
a post-step after the removing the portion to be removed with a removal of the transfer template, while retaining the reserved portion on the substrate, the post-step comprising: manufacturing sequentially a second carrier transporting layer and a second electrode on a side of sub-pixels of various colors facing away from the substrate.

17. The method according to claim 1, wherein the quantum dot layer is formed on the substrate by spin-coating a quantum dot material modified by ligands.

\* \* \* \* \*